United States Patent [19]

Sano

[11] Patent Number: 5,654,921
[45] Date of Patent: Aug. 5, 1997

[54] NON-VOLATILE MEMORY DEVICE EQUIPPED WITH MEANS TO ELECTRICALLY ERASE DATA

[75] Inventor: Yuuichi Sano, Kumamoto, Japan

[73] Assignee: NEC Corporation, Japan

[21] Appl. No.: 603,787

[22] Filed: Feb. 20, 1996

[30] Foreign Application Priority Data

Feb. 21, 1995 [JP] Japan .................... 7-032179

[51] Int. Cl.$^6$ ................................... G11C 11/34
[52] U.S. Cl. .................. 365/185.32; 365/185.2; 365/185.24
[58] Field of Search ............. 365/185.2, 185.24, 365/185.32

[56] References Cited

FOREIGN PATENT DOCUMENTS 5-258583  10/1993  Japan .

*Primary Examiner*—David C. Nelms
*Assistant Examiner*—F. Niranjan
*Attorney, Agent, or Firm*—Laff, Whitesel, Conte & Saret, Ltd.

[57] ABSTRACT

The non-volatile memory includes a word line potential control circuit in a non-volatile memory having a memory cell array, word lines, bit lines, an X decoder, a bit line selector, and a source voltage applying circuit. The word line potential control circuit is provided with a threshold voltage detection circuit and a plurality of word line potential control transistors. The threshold voltage detection circuit includes a threshold voltage holding memory cell transistor having a simultaneously processed identical structure as the memory cell transistors and disposed adjacent to the memory cell transistors so as to hold a threshold voltage after ultraviolet light erasing. The threshold voltage detection circuit detects whether a threshold voltage of the threshold voltage holding memory cell transistor is above or below a predetermined reference voltage. Each of the word line potential control transistors has a drain connected to a corresponding one of the word lines and turns on and off in accordance with a detection result from the threshold voltage detection circuit thereby controlling respective potentials of the word lines to one of first and second potentials. In this way, variations in the threshold voltages after the electrical erasing can be reduced.

6 Claims, 5 Drawing Sheets

NON-VOLATILE MEMORY DEVICE EQUIPPED WITH MEANS TO ELECTRICALLY ERASE DATA

BACKGROUND OF THE INVENTION (1) Field of the Invention

The present invention relates to a non-volatile memory, and more particularly to a non-volatile memory device equipped with a means to electrically erase data of a memory cell.

(2) Description of the Related Art

First, a memory cell used in a conventional non-volatile memory of the kind to which the present invention relates is explained. FIG. 1 is a sectional view showing a memory cell structure in which data can be erased electrically. The structure and the basic write and erase operation of the memory cell are now explained.

A drain 102 and a source 103 of an N-type diffusion layer are formed within a surface region of a P-type semiconductor substrate 101. A tunnel oxide film 104 is formed on the P-type semiconductor substrate 101 and a floating gate 105 is formed on the tunnel oxide film 104. Further, an oxide film 106 is formed on the floating gate 105 and a control gate 107 is formed on the oxide film 106. This memory cell is a field effect transistor having a floating gate (hereinafter referred to as a "memory cell transistor").

There are two types of writing in the memory cell transistor. One is a channel hot electron injection type in which a high voltage is applied between the control gate 107 and the drain 102 with the source 103 being grounded and a hot electron generated by the flowing of a channel current is injected into the floating gate 105 through the tunnel oxide film 104. The other is a tunnel writing type in which a high voltage is applied to the control gate 107 with the drain 102 being open and the source 103 being grounded and, due to the tunnel effect between the floating gate 105 and the source 103, the electron is injected from the source 103 to the floating gate 105. The channel hot electron injection type is usually used for the writing in a unit of byte and the tunnel writing type is used for the writing of total bits at once. By this writing, the threshold voltage of the memory cell transistor rises to about 6 V from the erased state of 2 V.

For the erasing, the control gate 107 is grounded or set to a predetermined positive voltage with the drain 102 being open and the source receiving a high voltage and, due to the tunnel effect between the floating gate 105 and the source 103, the electrons charged or accumulated at the floating gate 105 are drawn to the source 103. By this erasing, the threshold voltage of the memory cell transistor falls to about 2 V from the writing state of 6 V. After the erasing, it is possible for the threshold voltage of the memory cell transistor to become negative, that is, a depletion type, and be always in an ON state when a voltage higher than the ground potential is applied to the control gate 107. This is called "excess erasing". Further, where the threshold voltage of the memory cell transistor after the erasing is high, there arises a problem that no sufficient ON current can be obtained while, where such threshold voltage is low, there arises a problem that the OFF current exceeds the permissible range.

For the memory transistor of the kind explained above, normally the ultraviolet light erasing is carried out, for example, during the last step of the diffusion process, and the threshold voltage of the memory transistor after the ultraviolet light erasing is determined by its oxide film thickness, its channel impurity concentration, etc. FIG. 2 shows in a graph the relation between the threshold voltages after the ultraviolet light erasing and the threshold voltages after the above explained electrical erasing that is obtained at each of the control gate voltages (Vcg) during the electrical erasing. It can be appreciated from FIG. 2 that the threshold voltage after the electrical erasing is higher as the threshold voltage of the memory cell transistor after the ultraviolet light erasing is higher and also as the control gate voltage Vcg during the erasing is higher. That is, where the control gate voltage Vcg is fixed, the threshold voltage after the electrical erasing varies depending on the variations in the thicknesses of the gate oxide film or the impurity concentrations of the channel of the memory transistor. For example, where, between chips or wafers, the threshold voltages of the memory transistor after the ultraviolet light erasing vary between 2 V and 4 V and, if the control gate voltage Vcg during the electrical erasing is 0 V, the threshold voltage of the memory transistor after the electrical erasing will have a variation of 2 V, that is, between 0 V and 2 V.

In order to solve the above problem, it is necessary to suppress the variations in the threshold voltages of the memory cell transistor after the electrical erasing. A method for this purpose is proposed in Japanese Patent Application Kokai Publication No. Hei-5 258583. According to the proposal, the excess erasing is made once until threshold voltage of the memory cell transistor in which the erasing rate is slowest becomes sufficiently low and, subsequently, the tunnel writing is carried out by applying the predetermined voltage to the control gate and injecting electrons to the floating gate of the memory cell transistor, and in this way the threshold voltage of the memory transistor is shifted to a positive direction and is made to converge to a predetermined fixed value. Here, by the tunnel writing, the threshold voltages of the memory cell transistor distributed at a lower voltage side are shifted to a positive direction so that, as shown by a dotted line in FIG. 2, the variation after the electrical erasing is suppressed to about 1 V even if the variation of the threshold voltage after the ultraviolet light erasing is between 2 V and 4 V.

Next, the configuration and the operation of the non-volatile memory having means to suppress the variation in the threshold voltage as explained above are explained. FIG. 3 is a circuit diagram showing an example of the conventional non-volatile memory of the related kind.

The non-volatile memory is composed of a memory cell array 1, a plurality of word lines WL1–WLm, a plurality of bit lines BL1–BLn, an X decoder 2, a Y decoder 3 and a bit line select circuit 4, a source voltage applying circuit 5, a write circuit 6, and a sense amplifier 7. In the memory cell array 1, a plurality of memory cell transistors MT11–MTmn each of which is a field effect transistor having a floating gate and constitutes a memory cell are arranged in a matrix form in row and column directions. Each of the word lines WL1–WLm is connected to a control gate of each memory cell transistor of the corresponding row provided in correspondence to each row of the memory cell transistors MT11–MTmn. Each of the bit lines BL1–BLn is connected to a drain of each memory cell transistor of the corresponding column provided in correspondence with each column of the memory cell transistors MT11–MTmn. The X decoder 2 controls the selection/non-selection and the potential of the word lines WL1–WLm in accordance with the operation mode control signal MCX and an X address signal ADX for controlling operation modes such as the read operation, write operation, and erase operation. The Y decoder 3 and the bit line select circuit 4 control the selection and connection between the bit lines BL1–BLm and the write circuit 6 and the sense amplifier 7 in accordance with the operation mode control signal and the Y address signal ADY. The source voltage applying circuit 5 applies an erase pulse (EP) of a predetermined pulse width and a predetermined voltage to a source (a source line SL) of one of the related memory transistors MT11–MTmn when the erase control signal ER is in an active level and renders the source line SL to a ground potential when in an inactive level. The write circuit 6 supplies a write voltage to the memory cell transistors MT11–MTmn through the bit line selection circuit 4. The sense amplifier 7 amplifies the read signal from the selected memory cell transistor.

The details of the X decoder 2 is shown in FIG. 4, in which each of the output circuit portions corresponding to the word lines WL1–WLm includes a NAND type logic gate G21, a CMOS inverter IV21 comprising a pair of transistors T21 and T22, a transistor T23 which controls by a first mode control signal MCX1 the connection between the inverter IV21 and a word line corresponding to this inverter IV21, and a transistor T24 which supplies the word line voltage Vwp in accordance with a second mode control signal MCX2.

Now, the erasing operation of the non-volatile memory of this embodiment is explained. The erasing of the memory is carried out by an excess erasing operation to cause the memory cell transistors MT11–MTmn to be in an excessively erased state and a tunnel write operation to reduce variations in the threshold voltages by compensating the excessively erased state. For the excess erasing operation, the Y select signals YS1–YSn are made low levels by the Y decoder 3 for the transistors T41–T4n to be turned off and the word lines WL1–WLm are made word line voltages Vwp in the order of 0 V or 1 V by the X decoder 2. Here, the word line voltage Vwp is supplied to the word lines WL1–WLm by turning off the transistor T23 and turning on the transistor T24 through the operation mode control signal MCX (MCX1, MCX2).

Then, in response to the active level of the erase control signal ER, an erase pulse EP of a high voltage having a predetermined width is outputted from the source voltage applying circuit 5 whereby the drains of the memory cell transistors MT11–MTmn change to an open state, the sources thereof change to a high voltage, and the control gates change to the word line voltage Vwp. Thus, the erasing is effected such that the memory cell transistor whose erase performance is the slowest results in an erased state.

Next, the tunnel write operation is explained. The Y select signals YS1–YSn are made low levels by the Y decoder 3 for the transistors T41–T4n to be turned off, and the word lines WL1–WLm are made a high voltage (by Vwp) on the order of 10 V by the X decoder 2. Further, the source line SL is made a ground potential level by the source voltage applying circuit 5 whereby the drains of the memory cell transistors MT11–MTmn change to an open state, the sources thereof change to a ground potential, and the control gates are made a high voltage, thus carrying out the tunnel write operation.

The erasing operation explained above enables the reduction of variations in the threshold voltages of the memory cell transistors MT11–MTmn after the erasing.

In the conventional non-volatile memory, in order to suppress the variations in the threshold voltages after the electrical erasing caused during the diffusion process by such variations as those in thicknesses of the gate oxide film and in channel impurity concentrations of the memory transistor, the erasing operation requires two steps, the first is to effect the preliminary excessive erasing and the second is to shift to the positive direction the threshold voltage of the memory cell transistor by the tunnel writing. A problem in this erasing operation is that, in addition to the complication in the operation, it requires time for the erasing. For example, in the case where the memory capacity is 32K bytes, the time required is about 0.1 seconds for the preliminary excessive erasing and about 0.5 seconds for the tunnel writing.

SUMMARY OF THE INVENTION

An object of the invention, therefore, is to overcome the problems existing in the prior art, and to provide a non-volatile memory in which the variations, after the electrical erasing, in the threshold voltages in memory transistors among a plurality of chips or in a single chip can be reduced, the electrical erasing operation is simplified, and the time required for the erasing operation is reduced.

According to one aspect of the invention, there is provided a non-volatile memory device comprising:

a memory cell array in which a plurality of memory cell transistors arranged in row and column directions are formed by field effect transistors each having a floating gate;

a plurality of word lines each of which is provided in correspondence to each row of the memory cell transistors and connected to a control gate of each memory cell transistor of a corresponding row;

a plurality of bit lines each of which is provided in correspondence to each column of the memory cell transistors and connected to a drain of each memory cell transistor of a corresponding column;

an X decoder which controls selection and non-selection and potentials of the word lines in accordance with operation mode control signals and X address signals for controlling operation modes including a read-out operation mode, a write operation mode and an erase operation mode;

a bit line selection means which controls selection and connection between a write circuit and a sense amplifier and the bit lines in accordance with the operation mode control signals and Y address signals;

a source voltage applying circuit which applies an erase pulse of a predetermined pulse width and voltage to each source of the memory cell transistors when an erase control signal is at an active level and renders each source of the memory cell transistors to a ground potential when at an inactive level; and a word line potential control means including a threshold voltage holding memory cell transistor which is disposed adjacent to the memory cell transistors and has a simultaneously processed identical structure as each of the memory cell transistors and which holds a threshold voltage after ultraviolet light erasing, the word line potential control means being for detecting a threshold voltage of the threshold voltage holding memory cell transistor and controlling a potential of the word lines during an erasing operation.

In the memory according to the invention, the provision is made of at least one threshold voltage detection memory cell transistor which is disposed adjacent to the memory cell transistors within the memory cell array and which has the same structure resulted from the same formation step as the memory cell transistors. During the erasing operation, the threshold voltage of the memory cell transistor is detected and, based on the detected result, the potentials of the control gates of the word lines, that is, the memory cell transistors within the memory cell array are controlled. Thus, it is possible to reduce the variations of the threshold voltages after the electrical erasing in the memory cell transistors within each of the memory cell arrays among a plurality of chips or in a single chip, and also to simplify the electrical erasing operation and to reduce the operating time.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

NOW, embodiments of the invention are made with reference to the accompanying drawings.

Figure 4:
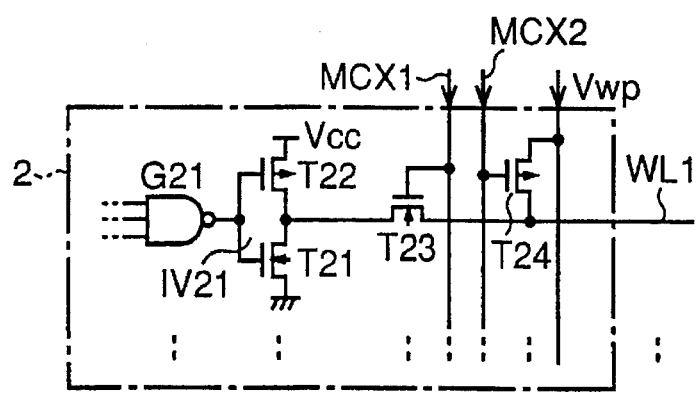
FIG. 4 is a circuit diagram showing a circuit configuration of the X decoder shown in FIG. 3.
Figure 5:
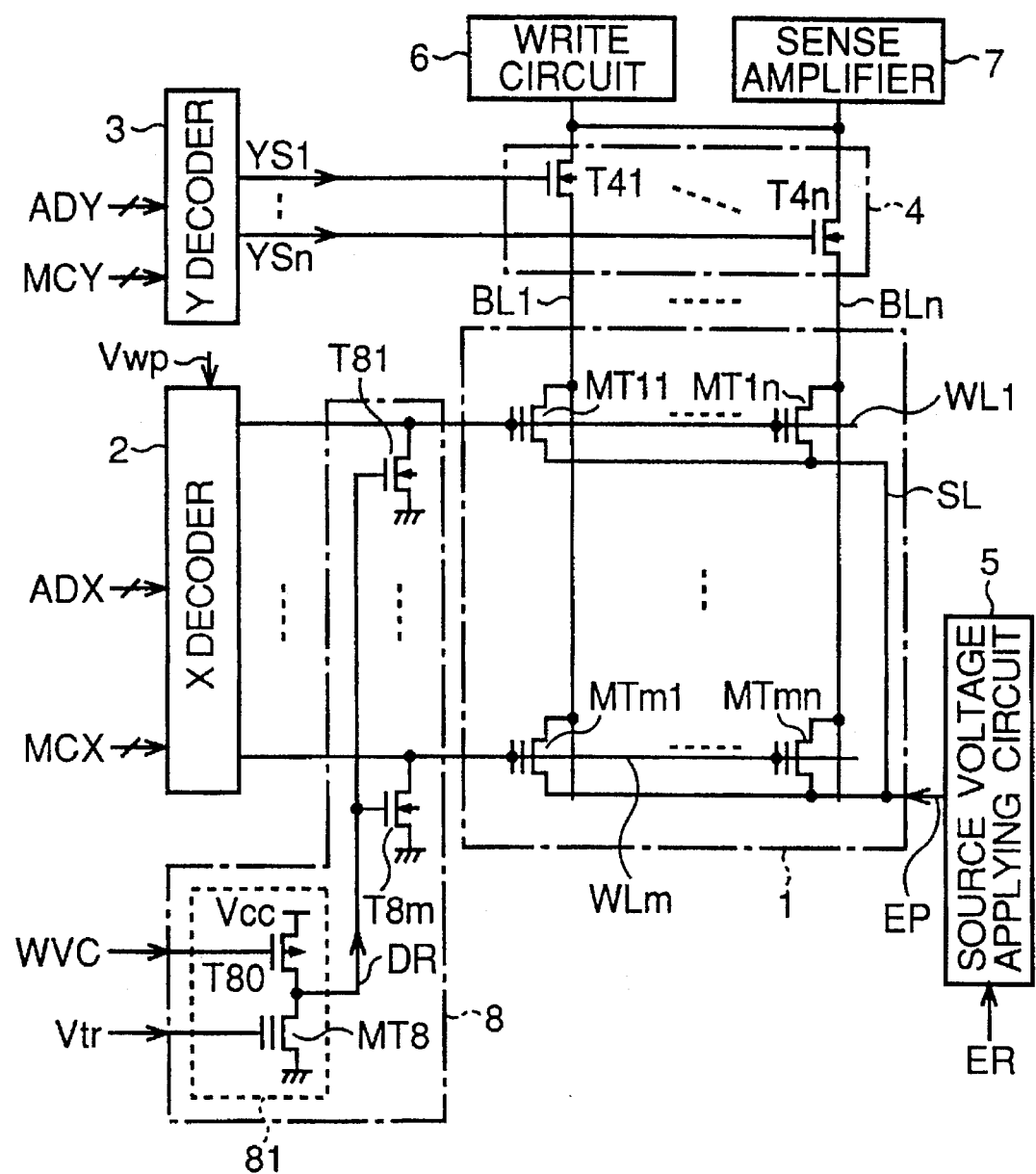
FIG. 5 is a circuit diagram showing a non-volatile memory of a first embodiment according to the invention.
Figure 6:
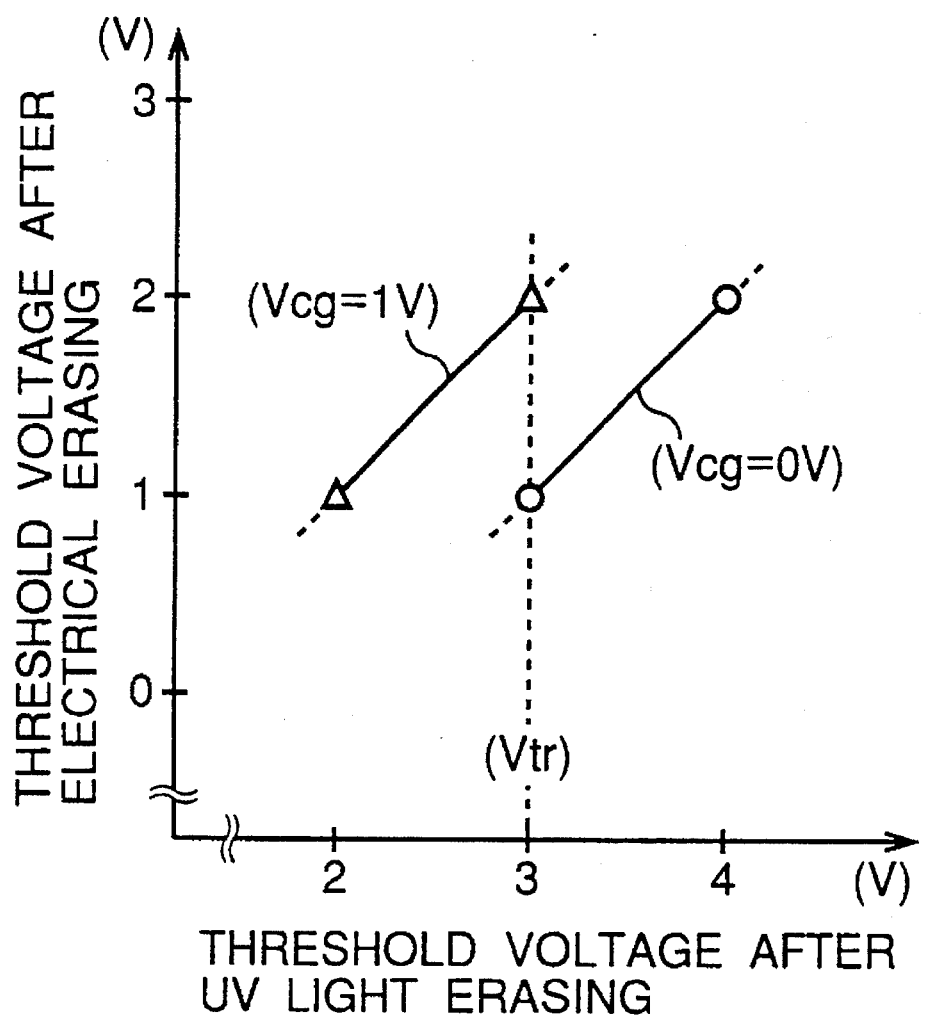
FIG. 6 is a graph showing the relation between threshold voltages after the ultraviolet light erasing and threshold voltages after electrical erasing for use in explaining effects of the non-volatile memory of first embodiment shown in FIG. 5.

FIGS. 5 and 6 are referred to for explaining a first embodiment of the invention. Compared with the prior art explained above, the non-volatile memory of this embodiment resides in the provision of a threshold voltage detection circuit 81 and a word line potential control circuit 8. The threshold voltage detection circuit 81 includes a threshold voltage holding memory cell transistor MT8 which is disposed adjacent to a plurality of memory cell transistors MT11–MTmn and has a simultaneously processed identical structure as the plurality of memory cell transistors MT11–MTmn, which holds a threshold voltage after the ultraviolet light erasing, and which has a control gate receiving a predetermined reference voltage Vtr and a source ground; and a load element transistor T80 which has a source connected to a power supply potential source Vcc, a drain connected to a drain of the above memory cell transistor MT8, and a gate receiving a word line potential control signal WVC, whereby the detection is made as to whether the threshold voltage of the memory cell transistor MT8 is above or below the reference voltage Vtr and the detected result signal DR is outputted from the drain of the memory cell transistor MT8. The word line potential control circuit 8 includes a plurality of transistors T81–T8m whose one ends (drains) are connected to respective ones of a plurality of word lines WL1–WLm, whose sources are grounded, and whose gates receive the detected result signal DR from the threshold voltage detection circuit 81 for the ON and OFF operation, and a potential control section which, together with a word line voltage Vwp supply transistor T24 (shown in FIG. 4) included in an X decoder 2, controls the potentials of the word lines WL1–WLm during the erase operation. These potential word lines are controlled in accordance with the threshold voltage of the memory cell transistor MT8.

Next, the erase operation for the memory in this embodiment is explained.

During the erase operation, the transistors T41–T4n are turned OFF by the Y decoder 3 when the Y select signals YS1–YSn are at low levels. Also, when the erase control signal ER is at an active level, an erase pulse EP of a predetermined pulse width and a high voltage is applied to a source line SL by the source voltage applying circuit 5.

To the word lines WL1–WLm, the word line voltage Vwp of a predetermined potential or the ground potential 0 V is applied as explained below. First, the word line potential control signal WVC is made low level with the reference voltage Vtr being made 3V, and the transistor T80 is made to be ON, whereby the detection is made as to whether the threshold voltage of the memory cell transistor MT8 is higher or lower than 3 V. When this threshold voltage is below 3 V, the memory cell transistor MT8 turns on and, when the same is above 3 V, the memory cell transistor MT8 turns off.

The P-channel type transistor T80 is used solely as a load element so that the voltage of the word line potential control signal WVC which is the gate voltage may be supplied as a constant voltage only so as to turn the transistor T80 to be ON. Thus, this voltage is made 0 V here. Also, the reference voltage Vtr is a voltage for detecting the threshold voltage of the memory cell transistor MT8 so that this voltage value is determined by the dependency of the electrical erasing threshold voltage with respect to the pre-measured threshold voltage of the memory cell transistor MT8 after the ultraviolet light erasing that is made during, for example, at the last step of the diffusion process, and the tolerable range of the threshold voltage after the electrical erasing.

Figure 1:
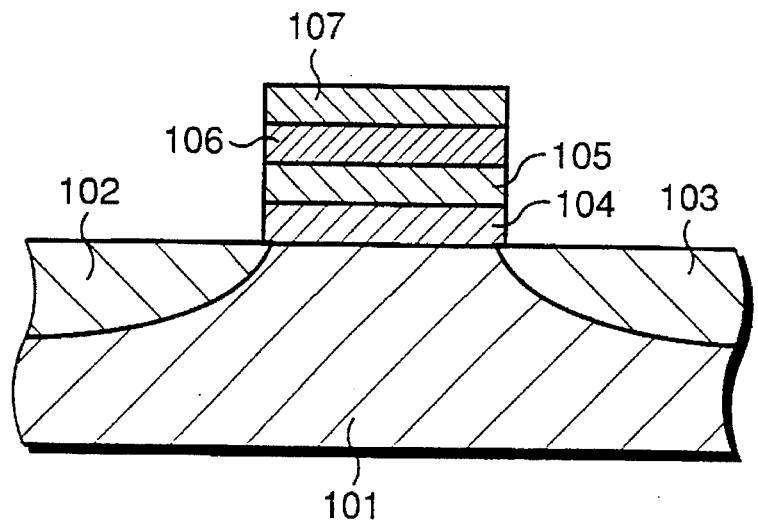
FIG. 1 is a sectional view of a memory cell used in a prior art non-volatile memory.
Figure 2:
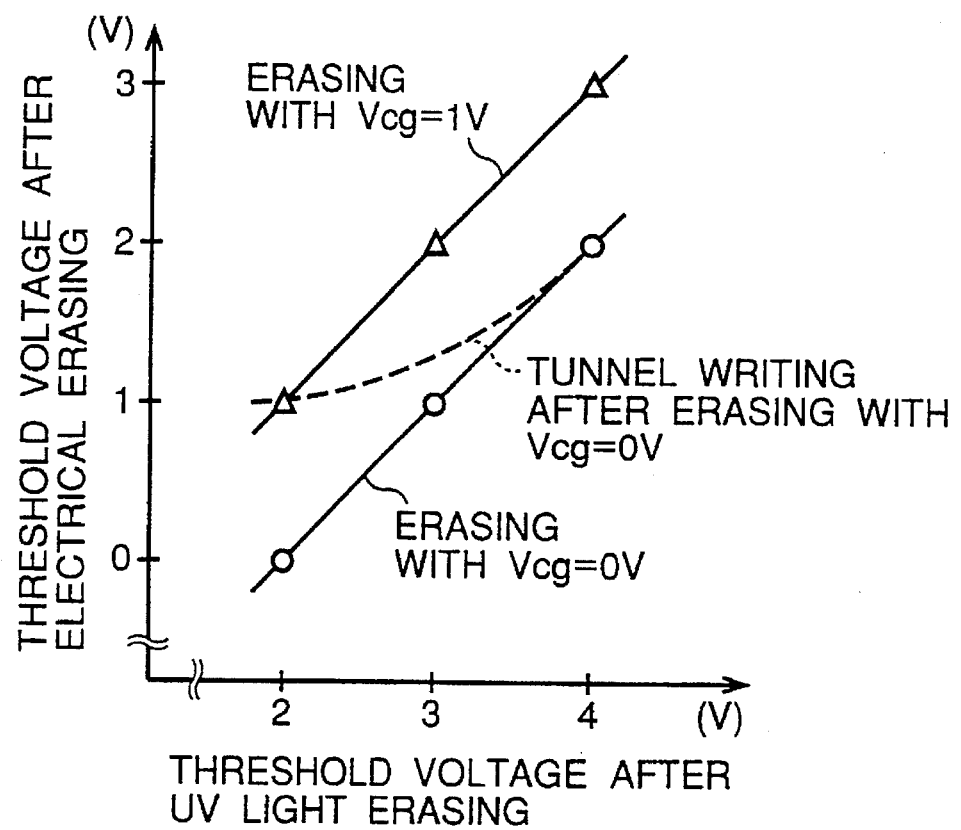
FIG. 2 is a graph showing the relation between threshold voltages after the ultraviolet light erasing and threshold voltages after electrical erasing in memory cell transistors used in the prior art non-volatile memory.
Figure 3:
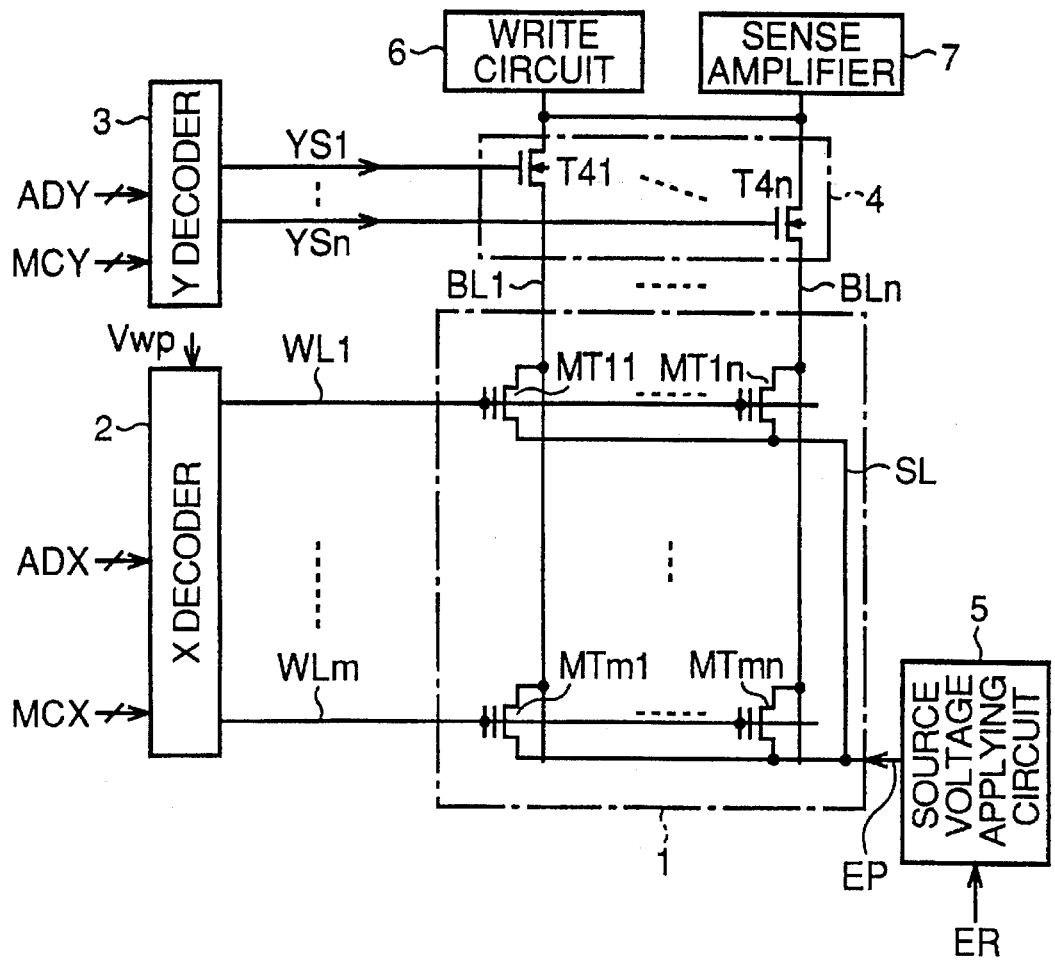
FIG. 3 is a circuit diagram showing an example of a prior art non-volatile memory.

In this embodiment, the dependency of the threshold voltage after the electrical erasing with respect to the threshold voltage of the memory transistor after the ultraviolet erasing is as shown in FIG. 2 and, on the basis that the tolerable range of the threshold voltage after the electrical erasing is 1 V–2 V, the reference voltage is set to 3 V. By this setting, the detection result signal DR changes to a low level when the threshold voltage of the memory transistor MT8 is above 3 V and the transistors T81–T8m turn off while, when below 3 V, the transistors T81–T8m turn on. When the transistors T81–T8m are OFF, the word line voltage Vwp is supplied from the X decoder 2 to the word lines WL1–WLm and, when the transistors T81–T8m are ON, the ground potential 0 V is supplied to the word lines WL1–WLm through the transistors T81–T8m. Here, the power supply voltage Vcc is higher than the reference voltage Vtr so that the memory cell transistor MT8 has an ON resistance sufficiently lower than that of the transistor T80, and the transistors T81–T8m have the ON resistance set sufficiently lower than that of the transistor T24 of the X decoder 2.

With the above arrangement, the memory cell transistors MT11–MTmn are such that their drains are open and their sources receive an erase pulse EP of a high voltage and, to their control gates, the word line voltage Vwp is applied when the threshold voltage of the memory cell transistor MT8 is lower than the reference voltage Vtr, while the 0 V is applied when the same is higher, whereby the erasing operation is carried out. In this operation, since the threshold voltage holding memory cell transistor MT8 is disposed adjacent to the memory cell transistors MT11–MTmn, and has the same structure as and has been formed simultaneously with the memory cell transistors MT11–MTmn, the threshold voltages of these memory cell transistors result in substantially the same voltages. As shown in FIG. 6, where Vwp=1 V, if the threshold voltage of each memory cell transistor MT11–MTmn after the ultraviolet erasing is below 3 V, the erasing is effected under the control gate voltage Vcc=1 V and the threshold voltage of the memory cell transistor after the electrical erasing becomes 1 V–2 V while, if the threshold voltage after the ultraviolet erasing is above 3 V, the erasing is effected under the control gate voltage Vcg=0 V and the threshold voltage after the electrical erasing similarly becomes 1 V–2 V.

Therefore, even when there are variations between 2 V and 4 V in the threshold voltages of the memory cell transistors MT11–MTmn after the ultraviolet erasing among, for example, chips, the threshold voltage after the electrical erasing becomes 1 V–2 V, thus making it possible to suppress the variation within 1 V. Also, since there is no need to conduct tunnel writing unlike in the prior art, it is possible to simplify the electrical erasing operation and to shorten the operating time (for example, 0.1 seconds whereas 0.6 seconds in the prior art example).

Figure 7:
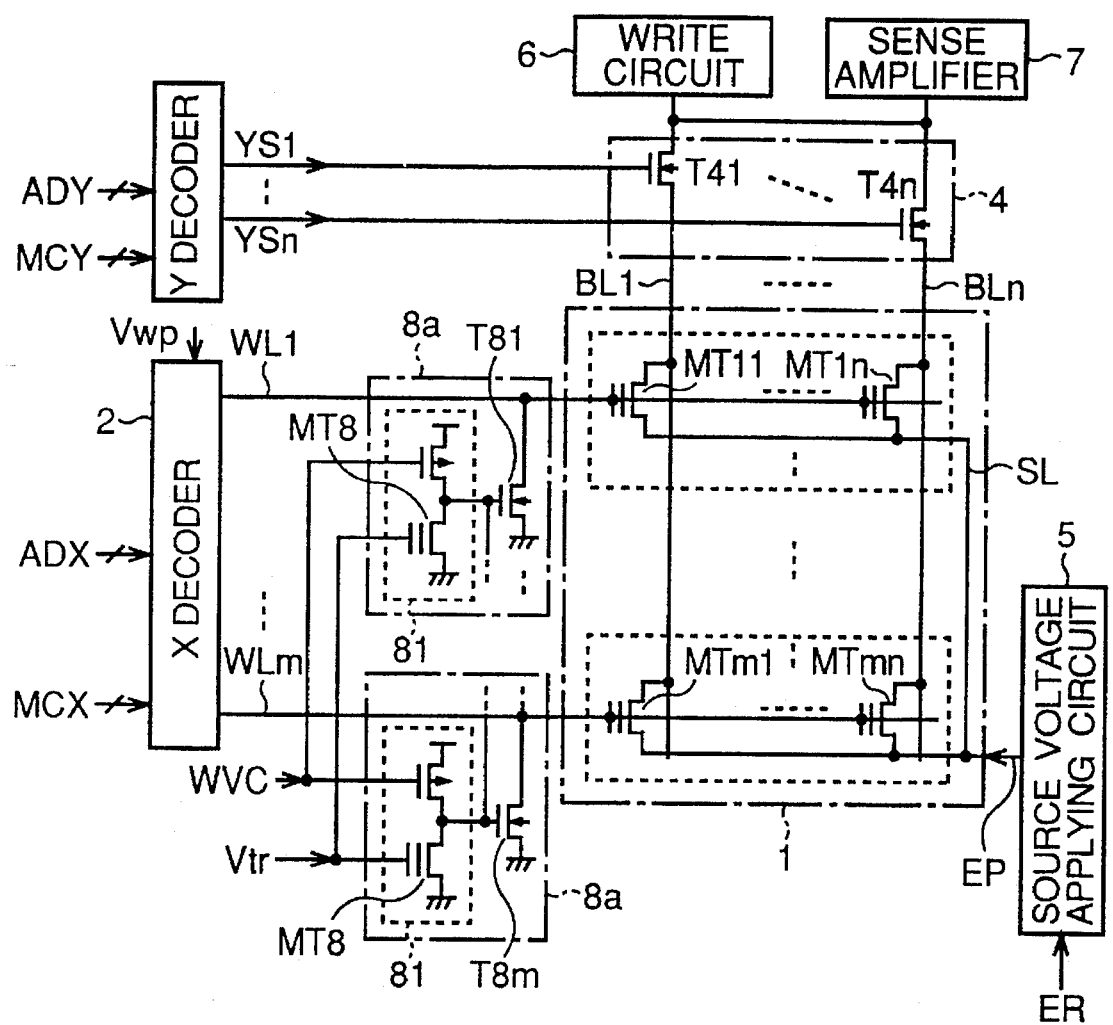
FIG. 7 is a circuit diagram showing a non-volatile memory of a second embodiment according to the invention.

Now, a second embodiment of the invention is explained with reference to FIG. 7.

In this embodiment, a plurality of word lines WL1 WLm are divided into a plurality of groups each with a predetermined number of them. Corresponding to each group of word lines, there are provided a plurality of word line potential control circuits 8a each of which includes a threshold voltage detection circuit 81 provided with a memory cell transistor MT8 that is disposed adjacent to a corresponding group of the memory cell transistors and has a simultaneously processed identical structure as the corresponding group of the memory cell transistors. The word line potential control circuit 8a controls the potential of the corresponding group of word lines according to the result detected by the threshold voltage detection circuit.

With the above arrangement, even when there are variations in the threshold voltages of the memory cell transistors MT11–MTmn within a chip or within a memory cell array 1, since the erasing operation can be carried out by controlling the potential of the word lines in the group after detecting the threshold voltage of the memory cell transistor in a region corresponding to the group within the memory cell array 1, it is possible to make a further reduction of the variations in the threshold voltages, after the electrical erasing, of the memory cell transistors MT11–MTmn within the memory cell array 1.

While the invention has been described in its preferred embodiments, it is to be understood that the words which have been used are words of description rather than limitation and that changes within the purview of the appended claims may be made without departing from the true scope of the invention as defined by the claims.

For example, although the reference voltage in the example of the first embodiment is 3 V, this can be set to a lower value by arranging a low power supply voltage operation, in so far as the function of detecting the threshold voltage of the memory cell transistors after the ultraviolet erasing and selecting the word line potential is satisfied. Also, the P-channel type transistor T80 used as an active load element for the threshold voltage detection circuit 81 may well be replaced by a passive load element such as an ordinary resistor.

What is claimed is:

1. A non-volatile memory device comprising:

a memory cell array in which a plurality of memory cell transistors arranged in row and column directions are formed by field effect transistors each having a floating gate;

a plurality of word lines each of which is provided in correspondence to each row of said memory cell transistors and connected to a control gate of each memory cell transistor of a corresponding row;

a plurality of bit lines each of which is provided in correspondence to each column of said memory cell transistors and connected to a drain of each memory cell transistor of a corresponding column;

an X decoder which controls selection and non-selection and potentials of said word lines in accordance with operation mode control signals and X address signals for controlling operation modes including a read-out operation mode, a write operation mode and an erase operation mode;

a bit line selection means which controls selection and connection between a write circuit and a sense amplifier and said bit lines in accordance with said operation mode control signals and Y address signals;

a source voltage applying circuit which applies an erase pulse of a predetermined pulse width and voltage to each source of said memory cell transistors when an erase control signal is at an active level and renders each source of said memory cell transistors to a ground potential when at an inactive level; and a word line potential control means including a threshold voltage holding memory cell transistor which is disposed adjacent to said memory cell transistors and has a simultaneously processed identical structure as each of said memory cell transistors and which holds a threshold voltage after ultraviolet light erasing, said word line potential control means being for detecting a threshold voltage of said threshold voltage holding memory cell transistor and controlling a potential of said word lines during an erasing operation.

2. A non-volatile memory device according to claim 1, in which said word line potential control means comprises a threshold voltage detection circuit for detecting whether a threshold voltage of said threshold voltage holding memory cell transistor is above or below a predetermined reference voltage, and a potential control section having a plurality of transistors each of which has an end connected to a corresponding one of said word lines and turns on and off in accordance with a detection result from said threshold voltage detection circuit thereby controlling respective potentials of said word lines to one of a first potential and a second potential.

3. A non-volatile memory device according to claim 2, in which said threshold voltage detection circuit has a threshold voltage holding memory cell transistor having a control gate receiving a predetermined reference voltage and a source connected to a ground potential node, and a load element connected between a drain of said threshold voltage holding memory cell transistor and a power supply potential node, and said potential control section has a plurality of transistors for supplying a predetermined potential with an ON resistance to a corresponding one of said word lines, each of said plurality of transistors having a first end connected to a corresponding one of said word lines, a second end connected to said ground potential node, and a gate receiving said detection result.

4. A non-volatile memory device according to claim 3, in which said load element comprises a load transistor having a source connected to said power supply potential node, a drain connected to the drain of said threshold voltage holding memory cell transistor, and a gate receiving a word line potential control signal.

5. A non-volatile memory device according to claim 2, in which said reference voltage for detecting the threshold voltage of said threshold voltage holding memory cell transistor is such that this voltage is determined by a dependency between a threshold voltage after electrical erasing and a threshold voltage after ultraviolet light erasing and a tolerable range of the threshold voltage after the electrical erasing.

6. A non-volatile memory device according to claim 1, in which said plurality of word lines are divided into a plurality of groups each having a predetermined number of word lines, and each of said groups of word lines is provided with a word line potential control circuit including a threshold voltage detection circuit having a threshold voltage holding memory cell transistor that is disposed adjacent to a corresponding group of said memory cell transistors and has a simultaneously processed identical structure as the corresponding group of said memory cell transistors.

* * * * *